(12) United States Patent
Fioriti et al.

(10) Patent No.: US 10,627,170 B2
(45) Date of Patent: Apr. 21, 2020

(54) FIBONACCI OPTIMIZED RADIAL HEAT TRANSFER

(71) Applicant: Aerco International, Inc., Blauvelt, NY (US)

(72) Inventors: Gerald A. Fioriti, Rock Tavern, NY (US); Kyle T. Morgan, Mount Sinai, NY (US)

(73) Assignee: Aerco International, Inc., Blauvelt, NY (US)

( * ) Notice: Subject to any disclaimer, the term of this patent is extended or adjusted under 35 U.S.C. 154(b) by 203 days.

(21) Appl. No.: 15/609,331

(22) Filed: May 31, 2017

(65) Prior Publication Data
US 2017/0350662 A1   Dec. 7, 2017

Related U.S. Application Data

(60) Provisional application No. 62/346,085, filed on Jun. 6, 2016.

(51) Int. Cl.
| | |
|---|---|
| *F28F 13/06* | (2006.01) |
| *F28D 7/10* | (2006.01) |
| *F28D 21/00* | (2006.01) |
| *F28D 15/02* | (2006.01) |
| *F28F 13/18* | (2006.01) |
| *F28D 7/16* | (2006.01) |

(Continued)

(52) U.S. Cl.
CPC ............... *F28F 13/06* (2013.01); *F28D 7/103* (2013.01); *F28D 7/16* (2013.01); *F28D 7/163* (2013.01);
(Continued)

(58) Field of Classification Search
CPC .... F28F 2210/10; F28F 13/003; F28F 13/185; F28F 3/022; F28D 1/053; F28D 1/05308;
(Continued)

(56) References Cited

U.S. PATENT DOCUMENTS

| | | | |
|---|---|---|---|
| 721,310 A * | 2/1903 | Junkers | ......................... 165/161 |
| 1,454,053 A | 5/1923 | Jones | |

(Continued)

FOREIGN PATENT DOCUMENTS

| | | |
|---|---|---|
| CN | 105070696 A | 11/2015 |
| CN | 105161472 A | 12/2015 |

(Continued)

OTHER PUBLICATIONS

European Patent Office, Extended European Search Report for Corresponding European Application No. 17173173.0, dated Oct. 11, 2017 (6 pgs).

(Continued)

*Primary Examiner* — Tho V Duong
(74) *Attorney, Agent, or Firm* — Harris Beach PLLC

(57) ABSTRACT

A heat transfer device for transferring heat energy to or from a gas or fluid flowing radially across a plurality of posts or tubes includes a plate having a plate surface. A plurality of posts or tubes are disposed on and protrude substantially perpendicular to the plate surface. At least about 50% of the plurality of posts or tubes are disposed according to a phyllotaxis layout. Each arc of a plurality of phyllotaxis spiral arcs of the phyllotaxis layout terminates at different locations along an arc radius on the plate at a phyllotaxis arc termination radius less than a perimeter radius.

17 Claims, 15 Drawing Sheets

(51) Int. Cl.
*F28F 3/02* (2006.01)
*H01L 23/367* (2006.01)
*H01L 23/473* (2006.01)
*H01L 23/467* (2006.01)

(52) U.S. Cl.
CPC .......... *F28D 7/1607* (2013.01); *F28D 15/02* (2013.01); *F28D 21/00* (2013.01); *F28F 3/022* (2013.01); *F28F 13/185* (2013.01); *H01L 23/3677* (2013.01); *H01L 23/467* (2013.01); *H01L 23/473* (2013.01); *F28D 2021/0029* (2013.01); *F28F 2210/10* (2013.01); *F28F 2245/00* (2013.01)

(58) Field of Classification Search
CPC ...... F28D 1/05316; F28D 7/16; F28D 7/1615; F28D 7/1619; F28D 7/103; F28D 7/1607; F28D 7/163; F28D 13/06; F28D 15/02; F28D 21/00; F21D 21/007; H01L 23/3677; H01L 23/467; H01L 23/473
USPC .......................................... 165/161, 157, 159
See application file for complete search history.

(56) References Cited

U.S. PATENT DOCUMENTS

| | | | |
|---|---|---|---|
| 1,522,866 A * | 1/1925 | Colston | .................... F28F 9/22 159/28.2 |
| 4,232,729 A | 11/1980 | Ingram et al. | |
| 4,357,991 A | 11/1982 | Cameron | |
| 5,638,898 A | 6/1997 | Gu | |
| 6,209,624 B1 * | 4/2001 | Cameron | ................ F24H 3/087 126/101 |
| 6,533,684 B2 | 3/2003 | Winfield et al. | |
| 2002/0019275 A1 | 2/2002 | Winfield et al. | |
| 2004/0238163 A1 | 12/2004 | Harman | |
| 2006/0231242 A1 | 10/2006 | Hawranek | |
| 2013/0269912 A1 | 10/2013 | Fetcu | |
| 2015/0000881 A1 * | 1/2015 | Tamura | ................... F28F 13/06 165/157 |
| 2017/0211887 A1 * | 7/2017 | Landry | .................... F28D 7/16 |
| 2017/0211895 A1 | 7/2017 | Frechette et al. | |
| 2017/0227293 A1 * | 8/2017 | Zaffetti | ................. F28D 7/022 |

FOREIGN PATENT DOCUMENTS

| | | | |
|---|---|---|---|
| DE | 10134330 C1 * | 9/2002 | ............. F25B 37/00 |
| DE | 102005049067 A1 | 4/2007 | |
| JP | 2012093084 A | 5/2012 | |
| WO | WO-2013102206 A1 | 7/2013 | |
| WO | WO-2017111636 A1 * | 6/2017 | ........... F28D 7/1669 |

OTHER PUBLICATIONS

ISA/U.S. International Search Report and Written Opinion for Corresponding International Application No. PCT/US2017/035383, dated Aug. 17, 2017 (8 pgs).

* cited by examiner

PRIOR ART

PRIOR ART r(n)=sqrt(n)
Theta(n)=2pi*phi*n

| 1 | n | radius* sqrt(n) | radius* Theta(rad) | convert to cartesian X | Y | mm X | Y |
|---|---|---|---|---|---|---|---|
| 1 | 1 | 1.12 | 3.883222073 | -0.8258531 | -0.75655 | -20.9767 | -19.2163 |
| 2 | 2 | 1.583919 | 7.766444145 | 0.1384753 | 1.577854 | 3.517273 | 40.0775 |
| 3 | 3 | 1.939897 | 11.64966622 | 1.1803086 | -1.5395 | 29.97984 | -39.1034 |
| 4 | 4 | 2.24 | 15.53288829 | -2.2057582 | 0.390168 | -56.0263 | 9.910257 |
| 5 | 5 | 2.504396 | 19.41611036 | 2.1130975 | 1.34418 | 53.67268 | 34.14216 |
| 6 | 6 | 2.743429 | 23.29933244 | -0.7122059 | -2.64937 | -18.09 | -67.294 |
| 7 | 7 | 2.963241 | 27.18255451 | -1.3657787 | 2.629724 | -34.6908 | 66.79499 |
| 8 | 8 | 3.167838 | 31.06577658 | 2.975618 | -1.08669 | 75.5807 | -27.602 |
| 9 | 9 | 3.36 | 34.94899865 | -3.1058011 | -1.28203 | -78.8873 | -32.5635 |
| 10 | 10 | 3.541751 | 38.83222075 | -1.5011571 | 3.207885 | 38.12939 | 81.48028 |
| 11 | 11 | 3.71462 | 42.7154428 | 1.1117256 | -3.54436 | 28.23783 | -90.0267 |
| 12 | 12 | 3.879794 | 45.59866487 | -3.356841 | 1.945358 | -85.2638 | 49.4121 |
| 13 | 13 | 4.038217 | 50.48188695 | 3.9440292 | 0.867083 | 100.1783 | 22.02392 |
| 14 | 14 | 4.190696 | 54.36510902 | -2.41017 | -3.42822 | -61.2183 | -87.0767 |
| 15 | 15 | 4.337741 | 58.24833109 | -0.5574458 | 4.301773 | -14.1591 | 109.265 |
| 16 | 16 | 4.46 | 62.13155316 | 3.4256273 | -2.88712 | 87.01093 | -73.3329 |
| 17 | 17 | 4.617878 | 66.01477524 | -4.6139349 | -0.1908 | -117.194 | -4.84633 |
| 18 | 18 | 4.751758 | 69.89799731 | 3.3681858 | 3.351794 | 85.55192 | 85.13557 |
| 19 | 19 | 4.881967 | 73.78171938 | -0.2255055 | -4.87676 | -5.72784 | -123.87 |
| 20 | 20 | 5.008792 | 77.664444145 | -3.2091786 | 3.845669 | -81.5131 | 97.68 |
| 21 | 21 | 5.132485 | 81.54766353 | 5.0866486 | -0.6844 | 129.2009 | -17.3838 |
| 22 | 22 | 5.253265 | 85.4308856 | -4.3121872 | -3.00031 | -109.53 | -76.2078 |
| 23 | 23 | 5.371331 | 89.31410767 | 1.1789077 | 5.24036 | 29.94426 | 133.1052 |
| 24 | 24 | 5.486857 | 93.19732975 | 2.7279598 | -4.76065 | 69.29018 | -120.921 |
| 25 | 25 | 5.6 | 97.08055182 | -5.3350794 | 1.702037 | -135.511 | 43.23173 |
| 26 | 26 | 5.710902 | 100.9637739 | 5.1843064 | 2.39528 | 131.6814 | 60.84012 |
| 27 | 27 | 5.819691 | 104.846996 | -2.2467568 | -5.36851 | -57.0676 | -136.36 |
| 28 | 28 | 5.926483 | 108.730218 | -2.0058309 | 5.576723 | -50.9481 | 141.6483 |
| 29 | 29 | 6.031385 | 112.6134401 | 5.3389175 | -2.80599 | 135.6085 | -71.2721 |
| 30 | 30 | 6.134493 | 116.4966622 | -5.9318706 | -1.56362 | -150.67 | -39.715 |
| 31 | 31 | 6.235896 | 120.3798843 | 3.3726087 | 5.24518 | 85.66426 | 133.2276 |
| 32 | 32 | 6.335677 | 124.2631063 | 1.0731117 | -6.24414 | 27.25704 | -158.601 |
| 33 | 33 | 6.43391 | 128.1463284 | -5.0867979 | 3.939503 | -129.205 | 100.0634 |
| 34 | 34 | 6.530666 | 132.0295505 | 6.5083684 | 0.539204 | 165.3126 | 13.695.78 |
| 35 | 35 | 6.626009 | 135.9127725 | -4.4995869 | -4.86392 | -114.29 | -123.544 |
| 36 | 36 | 6.72 | 139.7959946 | 0.0327832 | 6.71992 | 0.832692 | 170.686 |
| 37 | 37 | 6.812694 | 143.6792167 | 4.5773472 | -5.04586 | 116.2646 | -128.165 |
| 38 | 38 | 6.904144 | 147.5624388 | -6.8746815 | 0.637145 | -174.617 | 16.18349 |
| 39 | 39 | 6.994398 | 151.4456608 | 5.5714544 | 4.228534 | 141.5149 | 107.4048 |
| 40 | 40 | 7.083502 | 155.3288829 | -1.2678319 | -6.96912 | -32.2029 | -177.016 |
| 41 | 41 | 7.171499 | 159.212105 | -3.8195794 | 6.069696 | -97.0173 | 154.1703 |
| 42 | 42 | 7.25843 | 163.0953271 | 7.0002988 | -1.91849 | 177.8076 | -48.7297 |
| 43 | 43 | 7.344331 | 166.9785491 | -6.5341515 | -3.35322 | -165.967 | -85.1717 |
| 44 | 44 | 7.42924 | 170.8617712 | 2.5825301 | 6.965927 | 65.59626 | 176.9345 |
| 45 | 45 | 7.513188 | 174.7449933 | 2.837791 | -6.95868 | 71.95289 | -176.751 |
| 46 | 46 | 7.59621 | 178.6282153 | -6.8643586 | 3.253149 | -174.355 | 82.63 |
| 47 | 47 | 7.678333 | 182.5114374 | 7.3375136 | 2.262232 | 186.3728 | 57.4607 |
| 48 | 48 | 7.759588 | 186.3945595 | -3.9234225 | -6.69462 | -99.6549 | -170.043 |
| 49 | 49 | 7.84 | 190.2778816 | -1.6460249 | 7.665259 | -41.809 | 194.6976 |
| 50 | 50 | 7.919596 | 194.1611036 | 6.4564262 | -4.58635 | 163.9932 | -116.493 |

FIG.3A

FIBONACCI OPTIMIZED RADIAL HEAT TRANSFER

CROSS-REFERENCE TO RELATED APPLICATIONS

This application claims priority to and the benefit of co-pending U.S. provisional patent application Ser. No. 62/346,085, FIBONACCI OPTIMIZED RADIAL HEAT EXCHANGER, filed Jun. 6, 2016, which application is incorporated herein by reference in its entirety.

FIELD OF THE APPLICATION

The application relates to heat exchangers and particularly to a heat exchanger tube or rod distribution for a radial heat exchanger.

BACKGROUND

An efficient means to heat water is to flow hot gas from a burner through a heat exchanger of a hot water heater. The heat energy of the hot gas is transferred to the water, typically by passing either of the water or the heated gas (e.g. flue gas) through a plurality of tubes, and the other of the water or heated gas on the outside of the tubes. One common type of cylindrical heat exchanger has two or more tube sheets to support a plurality of tubes within the cylinder. The tubes, which run lengthwise through cylinder are distributed along the tube sheets.

SUMMARY

According to one aspect, a heat transfer device for transferring heat energy to or from a gas or fluid flowing radially across a plurality of posts or tubes includes a plate having a plate surface. A plurality of posts or tubes are disposed on and protrude substantially perpendicular to the plate surface. At least about 50% of the plurality of posts or tubes are disposed according to a phyllotaxis layout. Each arc of a plurality of phyllotaxis spiral arcs of the phyllotaxis layout terminates at different locations along an arc radius on the plate at a phyllotaxis arc termination radius less than a perimeter radius.

In one embodiment, at least one or more posts or tubes of the plurality of posts or tubes includes a heat pipe.

In another embodiment, a surface of at least one or more posts or tubes of the plurality of posts or tubes includes a nano texture or a semi-porous surface treatment or material deposit.

In yet another embodiment, a surface of at least one or more posts or tubes of the plurality of posts or tubes includes a surface treatment or a variable density surface treatment.

In yet another embodiment, the phyllotaxis layout includes a Fibonacci optimized radial heat transfer (FORHT) pattern, and a plurality of phyllotaxis spiral arcs include a first number of clockwise spiral arcs and a second different number of counter clockwise spiral arcs.

In yet another embodiment, the first number of clockwise spiral arcs includes a first Fibonacci number and the second different number of counter clockwise spiral arcs includes a second Fibonacci number, and the first Fibonacci number and the second Fibonacci number are consecutive Fibonacci numbers.

In yet another embodiment, the plate includes a first tube sheet having a hole pattern in which each tube of a plurality of tubes is mechanically affixed in each hole of the hole pattern.

In yet another embodiment, the heat transfer device further includes a second tube sheet having substantially a same hole pattern as the first tube sheet. Each tube of a plurality of tubes is mechanically affixed in each hole of the hole pattern at an end of each tube opposite the first tube sheet.

In yet another embodiment, the first tube sheet and the plurality of tube are disposed in a cylindrical enclosure.

In yet another embodiment, the heat transfer device includes a heat exchanger of a hot water heater.

In yet another embodiment, a gas flows through each of the tubes and a fluid flows about radially in the cylindrical enclosure along a plurality of outer tube walls to exchange heat energy between the gas and the fluid.

In yet another embodiment, the heat transfer device further includes at least one donut baffle to cause cold water entering the heat exchanger to flow about radially.

In yet another embodiment, the heat transfer device further includes at least one disc baffle to cause an about radial flow of water in a direction from an inner wall surface of the cylindrical enclosure towards a center long axis of the cylindrical enclosure of the heat exchanger.

In yet another embodiment, the heat transfer device further includes at least one disc baffle and at least one adjacent donut baffle to cause an about radial flow of water in a direction from an inner wall surface of the cylindrical enclosure towards a center opening of the adjacent donut baffle.

In yet another embodiment, the posts or tubes include posts or tubes of a heat sink.

In yet another embodiment, the heat transfer device further includes a fan to blow a cooling air into the plurality of posts or tubes in a direction of about a long axis of each post or tube of the plurality of posts or tubes such that an air flow turns into a substantially symmetric radial flow pattern across the posts or tubes to cause a substantially uniform radial air flow through the plurality of posts or tubes over the plate.

In yet another embodiment, the heat sink further includes at least one baffle to effect about a radial air flow about perpendicular to the plurality of posts.

The foregoing and other aspects, features, and advantages of the application will become more apparent from the following description and from the claims.

BRIEF DESCRIPTION OF THE DRAWINGS

The features of the application can be better understood with reference to the drawings described below, and the claims. The drawings are not necessarily to scale, emphasis instead generally being placed upon illustrating the principles described herein. In the drawings, like numerals are used to indicate like parts throughout the various views.

FIG. 3A shows a table of an exemplary worksheet to calculate hole positions according to a new Fibonacci Optimized Radial Heat Transfer (FORHT) tubesheet layout tubesheet system and method;

DETAILED DESCRIPTION

Definitions

Figure 1:
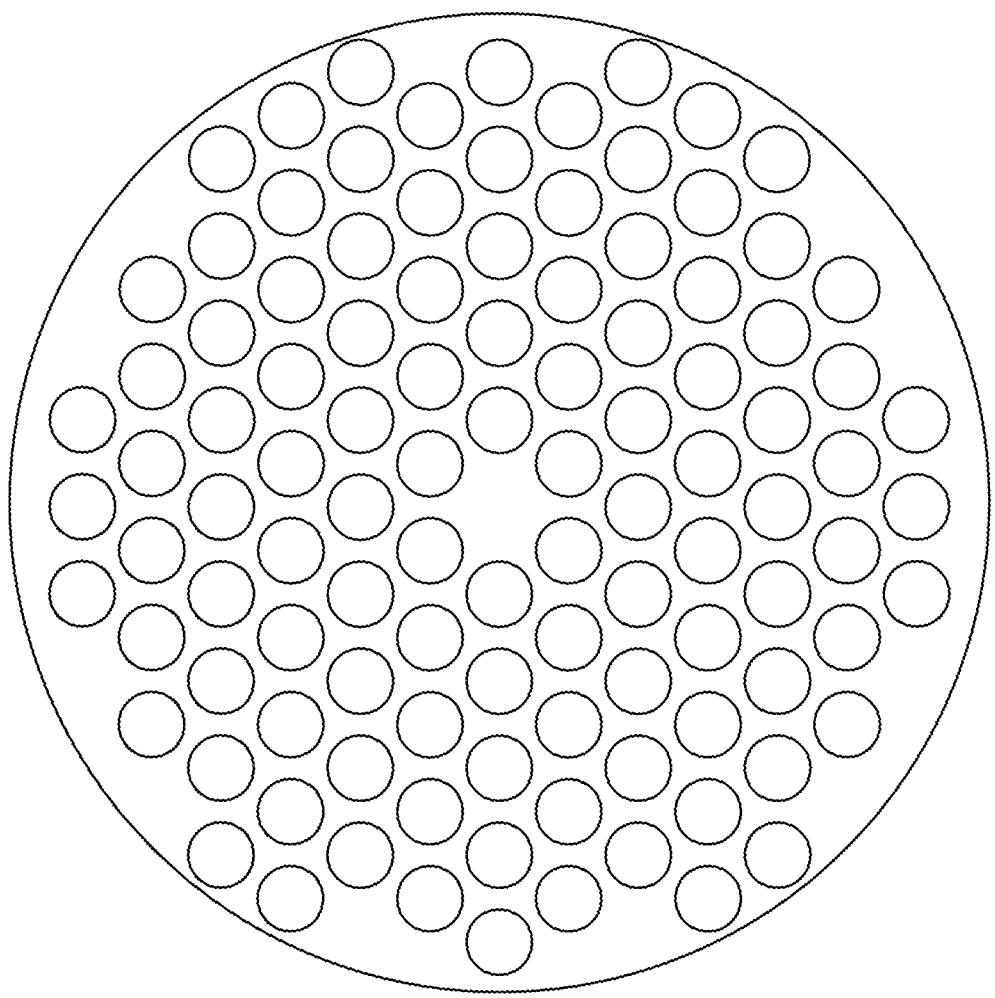
FIG. 1 shows a drawing of an exemplary Cartesian coordinate tubesheet layout.

Heat Exchanger: A heat exchanger as used hereinbelow includes a structure which exchanges or transfers heat from a solid, liquid or gas by use of a solid structure to or from another different solid, liquid or gas. For example, a heat sink, such as a heatsink used in electronics applications, typically transfers heat from a solid case of one or more electronics packages to air via a solid heatsink structure. Or, for example, in water heaters, a heat exchanger typically includes a plurality of tubes which transfer heat energy from a hot flue gas to heat cold water. The flue gas can be passed through the tubes to heat water outside of the tubes in a heat exchanger enclosure. Or, the water to be heated can be flowed through the tubes with the flue gas passing along the outside of heat exchanger tubes flowing the water to be heated.

Posts and Tubes: Typically, tubes are cylindrical tubes. However, as used hereinbelow, tubes include any longwise structure of any suitable shape which allow a gas or fluid to flow lengthwise within, and another gas or fluid to flow along an outer surface for the purpose of exchanging heat energy between the gas or fluid within the tube and the gas or fluid flowing past an outer surface of the tube. For example, the tubes can be square or rectangular tubes with square lengthwise paths inside. Tubes of any suitable external geometry can be used. Similarly, the interior lengthwise passages can be square rectangular, round, or have any other suitable shaped opening. Posts, such as the posts of a heatsink, typically transfer heat energy by conduction to or from solid posts to or from a gas or fluid flowing past and over the external surfaces of each post of a plurality of posts. The posts can be round, rectangular, square, triangular, or of any suitable post shape.

Heat Pipes: Either of the tubes or posts hereinbelow can be replaced in part or in whole by heat pipes. A heat pipe transfers heat from one end to another opposite end by an evaporation-condensation cycle, typically based on a phase transition between a liquid and a gas.

Perimeter radius: Posts and/or tubes can be distributed on any suitable surface of any suitable plate according to the new Fibonacci Optimized Radial Heat Transfer (FORHT) layout as described in more detail hereinbelow. The FORHT layout has a circularly symmetric pattern which can be defined within a pattern radius. Further, the pattern radius can fall within a perimeter radius to have sufficient clearance from an outside edge of a heat transfer device. The shape of the plate which supports posts and/or tubes of a FORHT layout is unimportant. For example, the plate can be a circular plate, where the perimeter radius is the radius of the circular plate. Or, in other exemplary embodiments, the plate can be a square or rectangular plate which includes the perimeter radius on a surface of the non-circular plate. Similarly, a perimeter radius can be defined by the inside wall surface of a cylindrical enclosure disposed on or above a circular or non-circular plate.

As described hereinabove, efficient means to heat water is to flow hot gas from a burner through a heat exchanger of a hot water heater. The heat energy of the hot gas is transferred to the water, typically by passing either of the heated gas (e.g. flue gas) through a plurality of tubes, and the other of the water or heated gas on the outside of the tubes. One common type of cylindrical heat exchanger has two or more tube sheets to support a plurality of tubes within the cylinder. The tubes, which run lengthwise through cylinder are distributed along the tube sheets.

For example, in U.S. patent application Ser. No. 13/892,920, WATER HEATING APPARATUS WITH PARALLEL HEAT EXCHANGERS, by Fioriti which patent is also assigned to the current assignee, AERCO, International, Inc., such heat exchangers that transfer between a first fluid (preferably a hot gas) and a second fluid (preferably water) were described. Hot water heat exchangers can be constructed, for example, from an upright cylindrical outer housing and two tubesheets. An upper tubesheet can be located at the combustion gas inlet/water flow exit, and a lower tubesheet can be located at the combustion gas exit/water flow inlet. The upper tubesheet and the lower tubesheet are typically welded at their periphery to the respective portion of the outer housing. The exemplary heat exchanger of the '920 patent further includes at least one, but preferably a plurality, of heat exchange tubes. In one embodiment, the tubesheets are typically flat disks having a plurality of holes in which the heat exchange tubes fit. The heat exchange tubes are welded between the two tubesheets. In one example, the lower tubesheet contained a circular pattern of holes along its outer edge through which the inlet water flows. The '920 application is incorporated herein by reference in its entirety for all purposes.

In U.S. Pat. No. 9,175,853 B2, WATER HEATING SYSTEM WITH OXYGEN SENSOR, to Fioriti, et. al., another water heating system was described that also includes a heat exchanger system coupled to a combustion chamber. There, the combustion of gases exited the combustion chamber to heat water also by use of a heat exchanger system. That heat exchange system could have different configurations, for example, the heat exchanger system of the exemplary '853 patent can include fire tubes or alternately water tubes as known in the art. The '853 patent is incorporated herein by reference in its entirety for all purposes.

The layout or pattern of the openings in two or more tubesheets establishes the pattern of the plurality of heat exchanger tubes, such as for a cylindrical heat exchanger. The openings have traditionally been provided in a pattern convenient to a Cartesian coordinate system, or otherwise cylindrically symmetric layout where a maximum number of tubes can be installed. Design concerns include adequate spacing and volume between the tubes and also sufficient spacing from the interior wall of the heat exchanger enclosure, typically a cylindrical enclosure.

FIG. 1 shows a drawing of an exemplary Cartesian coordinate tubesheet layout which has been used in AERCO heat exchangers. In one exemplary tube sheet, there were 106 tubes with a 7.5 mm web spacing between the tubes. This tube arrangement creates undesirable preferred flow paths from the center to the perimeter for the cooling fluid to travel, thereby starving other locations (more restrictive flow) and causing imbalance in heat transfer and temperature.

Figure 2A:
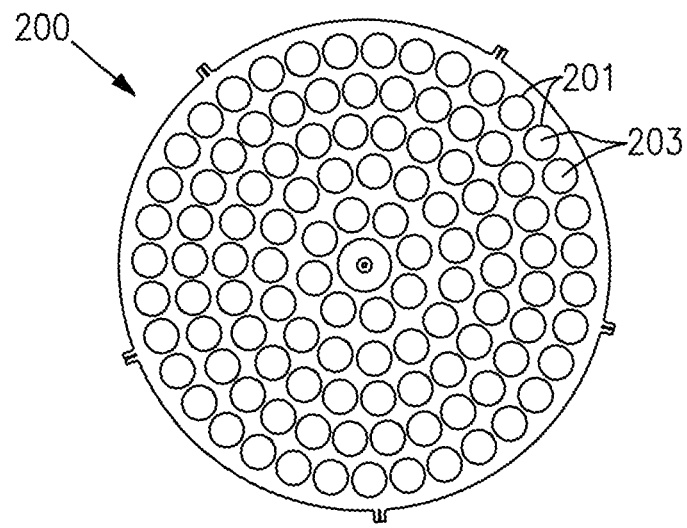
FIG. 2A shows a drawing of another exemplary radial tubesheet layout.
Figure 2B:
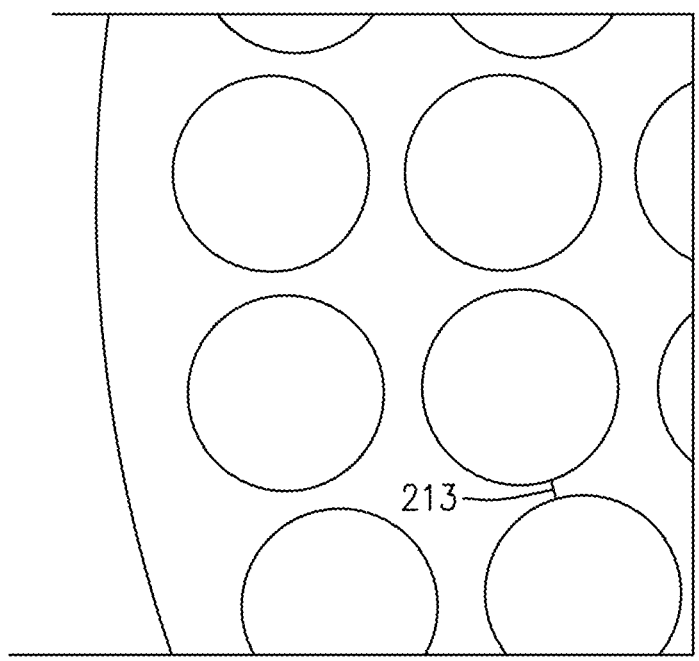
FIG. 2B shows a magnified view of the tubesheet layout of FIG. 2A.

FIG. 2A shows a drawing of another exemplary circular tube distribution tubesheet 200 layout. Cylindrical walls 201 in a substantially flat sheet define holes 203 for each tube (not shown in FIG. 2A) of a heat exchanger. FIG. 2B shows an example of possibly insufficient spacing 213 between some of the tube holes as a magnified view of a portion of the circular tube distribution tube sheet layout of FIG. 2A. The 3.68 mm minimum web is too close. One potential problem with this circular tube distribution tube sheet layout design is that the tube to tubesheet welds can overlap each other. Also, there can be weld interaction between welded tubes to the tubesheet during manufacturing. Another problem is there can be insufficient support during expansion caused by heating. However, a problem with the radial distribution is that every attempted arrangement of the tubes leaves at least one undesirable preferred flow path for the fluid traveling radially outward, causing an imbalance in the flow and the heat transfer from the tubes to the fluid.

What is needed is a new type of heat transfer structure which is optimized for a radial heat transfer pattern. Also, the new heat transfer structure can be applied to a tube sheet pattern for building hot water heat exchangers that are more efficient and cost effective to operate.

While solving the problem of non-uniform radial flow in a heat exchanger for a hot water heater, it was realized that there is a solution to radial flow which can be applied to solve the problem of non-uniform radial flow in many types of heat exchangers. Also, it was realized that the solution includes a new type of radial flow heatsink, such as can be used to replace many types of conventional electronics heatsinks.

The application relates generally to heat transfer to a fluid traveling radially from the center, outward to the perimeter of a heat exchanger. The heat is transferred between the solid tube walls or posts, and the fluid traveling radially outward. A "Phyllotaxis pattern" occurs in nature, pine cones, pussy willows, flower petals. The new application of a Phyllotaxis pattern of solid members (e.g. posts, tubes, or heat pipes) to heat exchangers is referred to as Fibonacci Optimized Radial Heat Transfer (FORHT).

In CN105070696A, Miniature radiator with columnar phyllotaxis configuration expanding structure, filed Aug. 5, 2015, Yushan, et. al. described a miniature radiator with phyllotaxis configuration. A crossed line phyllotaxy arrangement pattern of a pineapple leaf and pine cone arrangement sequence structure diagram, FIG. 1, '696 CN, was adapted for Yushan's micro heat sink. The inventors teach a pattern of crossed curved lines derived from the sides or outer parts of the pattern and employ a cross flow, not a radial flow. All of the heat sink pillars of the drawings FIG. 1-FIG. 8 of the '696 CN patent application follow the same crossed line pattern. While there may be some slight curvature of the lines related to phyllotaxy spirals, there were no centered spiral structures in the heat sink pillars.

In CN105161472A, Pin-column type mini-size radiator having end face with phyllotaxy structure, filed Aug. 5, 2015, a similar crossed line structure of curved crossed lines was adapted from a sunflower grain phyllotaxy structure. Again, the inventors teach an alternate pattern of crossed curved lines as the feature to be used in applying the sunflower grain phyllotaxy structure to a mini-column radiator pin end face, not the centered spiral pattern, and with a cross flow, not a radial flow.

In U.S. Pat. No. 6,533,684, Phyllotaxis-based dimple patterns, issued Mar. 18, 2003, Winfield, et. al., describes a method of packing dimples using phyllotaxis for golf balls. Winfield FIG. 1B shows a detail of the center of the view of the phyllotactic pattern of FIG. 1A, a front view of a phyllotactic pattern shows the overall spiral pattern. As described by Winfield, Phyllotaxis is the study of symmetrical patterns or arrangements. This is a naturally occurring phenomenon. Usually the patterns have arcs, spirals or whorls. The '684 patent is incorporated herein by reference in its entirety for purposes of describing phyllotaxis and related mathematics which are also well known in the arts of mathematics and plant phyllotaxis. For a number of aerodynamic and manufacturing reasons, Winfield teaches a golf ball where at least a portion of the plurality of indents are defined by phyllotactic generated arcs, and wherein a plurality of the arcs extends from indents located near an equator of the golf ball, and wherein at least one of the plurality of arcs terminates in a different location than other arcs.

It was realized that a heat exchanger can be made still more efficient by applying a Phyllotaxis layout, such as a golden ratio Phyllotaxis layout to the tube sheet tube hole pattern of a heat exchanger. The Fibonacci Optimized Radial Heat Transfer (FORHT) design that determines the location of tubes within a heat exchanger based on the "golden ratio" is described hereinbelow in more detail. Opposite from the teaching of a limited use of the Phyllotaxis crossed lines of the pin-column type mini-size radiator of the prior art, it was realized that in a new application of the Phyllotaxis patterns to a tubesheet pattern of a heat exchanger, the spiral patterns can be used to make the new and more efficient type of FORHT designed heat exchanger.

For this new FORHT application (e.g. for radial flow heatsinks or for heat exchanger tube sheets), in some embodiments, the pattern of tube sheet holes can be determined by:

$$r = \sqrt{n} \qquad \text{eq. (1)}$$

$$\theta = 2 \cdot \pi \cdot \Phi n \qquad \text{eq. (2)}$$

where in a cylindrical coordinate system, r is the radius, n is a number of a particular post of a heatsink or tube hole or tube center point on the tube sheet theta is the angle of that hole, and $\Phi$ (phi) is the golden ratio element 0.618033988. n can start at 0 or 1, or any other number (e.g. 10, which skips the first 9 tubes).

$$n = hn \cdot c \qquad \text{eq. (3)}$$

where hn is the hole number, and c is a scaling constant.

Corresponding Cartesian coordinates for each tube hole in the tube sheet can be calculated by the convention cylindrical to Cartesian coordinate conversion equations:

$$x = r \cdot \cos(\theta) \qquad \text{eq. (4)}$$

$$y = r \cdot \sin(\theta) \qquad \text{eq. (5)}$$

where x and y are the calculated Cartesian coordinates for each hole of the tube sheet.

Application of FORHT to Heat Exchangers for Fluids and/or Gases

In the description which follows, application of FORHT is described for a heat exchanger which includes a plurality of tubes according to a FORHT layout. The tubes can include a flow of liquid or water. There can be a flow of liquid or water outside of the tubes. Thus, the heat exchanger can be a gas to gas heat exchanger, a gas to liquid heat exchanger (gas or liquid in the tubes), or a liquid to liquid heat exchanger. The heat exchange of a hot water heater is but one example of a radial flow heat exchanger that can transfer heat from a gas to a liquid.

Figure 3B:
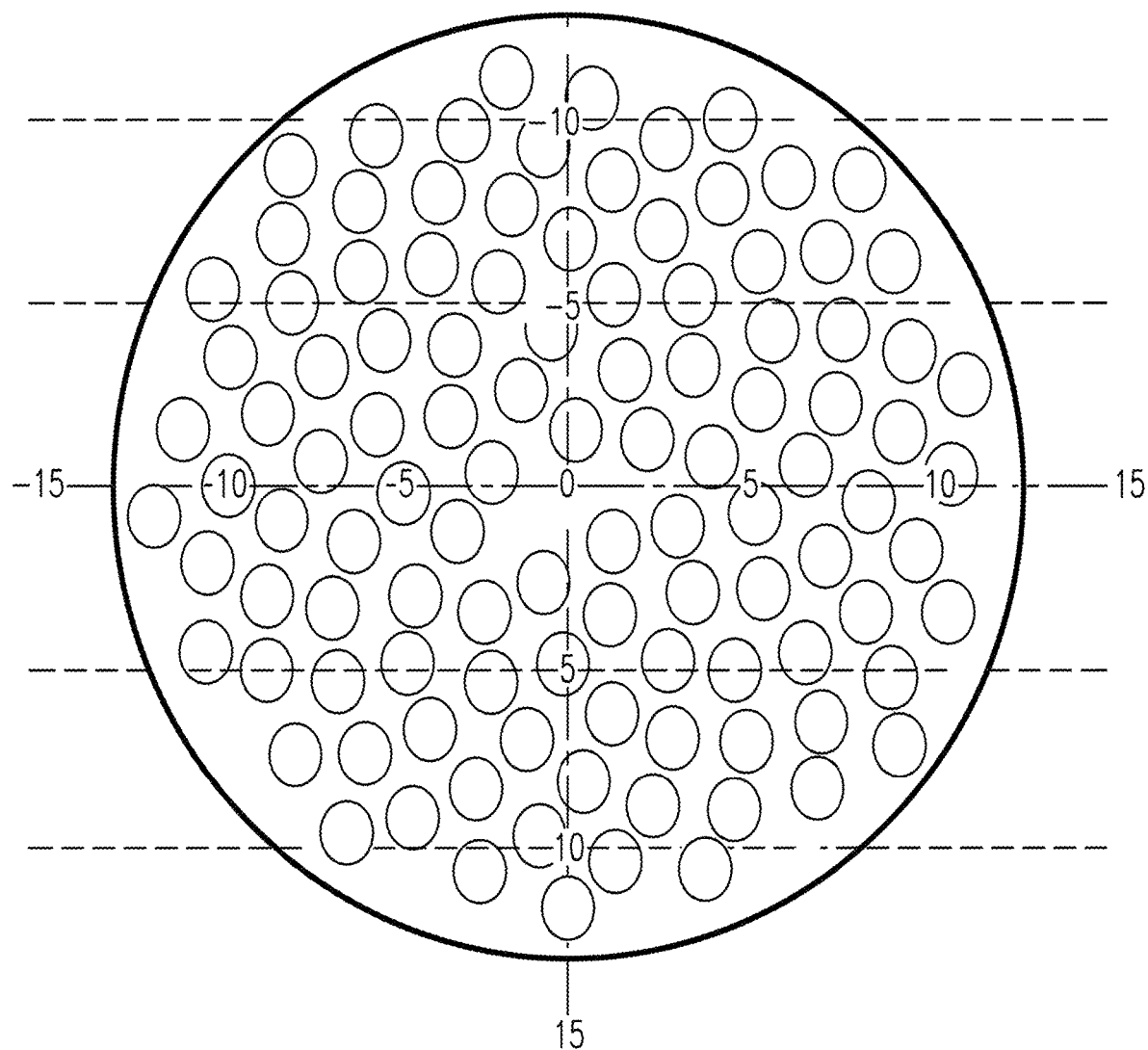
FIG. 3B shows a graph of the calculated FORHT tubesheet layout of FIG. 3A.

FIG. 3A and FIG. 3B shows an exemplary Excel™ model which can be used to calculate and display a graph of various FORHT tubesheets for different scaling constants based on equations 1-3, and equations 4-5 for conversion to Cartesian coordinates, such as can be useful for some computer controlled manufacturing machines and processes. The application of the worksheet of FIG. 3A and FIG. 3B applies equally well to other radial heat transfer structures, such as for example, a radial flow heat sink.

FIG. 3A shows a table of the Excel™ worksheet exemplary calculated hole positions according to the new FORHT tubesheet layout tubesheet system and method. FIG. 3B shows a graph of the calculated FORHT tubesheet layout of FIG. 3A. It was realized that the design variations are very sensitive for small variations in the constant c, such as, for example, over a relatively narrow range from about 0.9 to 1.2. The exemplary tube sheet hole graph of FIG. 3B shows the placement of a modeled number of holes (settable on the model worksheet) and a desired cylindrical enclosure boundary of a cylindrical heat exchanger enclosure.

Figure 4A:
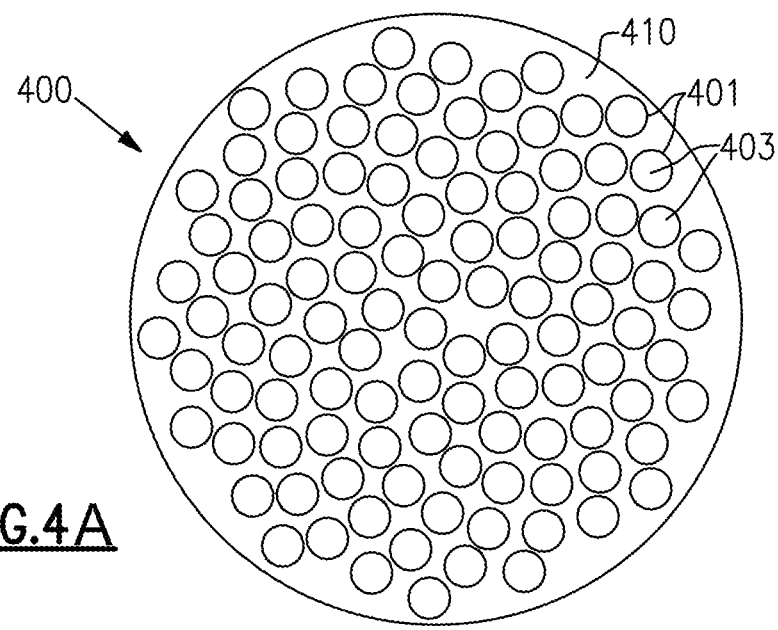
FIG. 4A shows an exemplary FORHT tubesheet pattern.
Figure 4B:
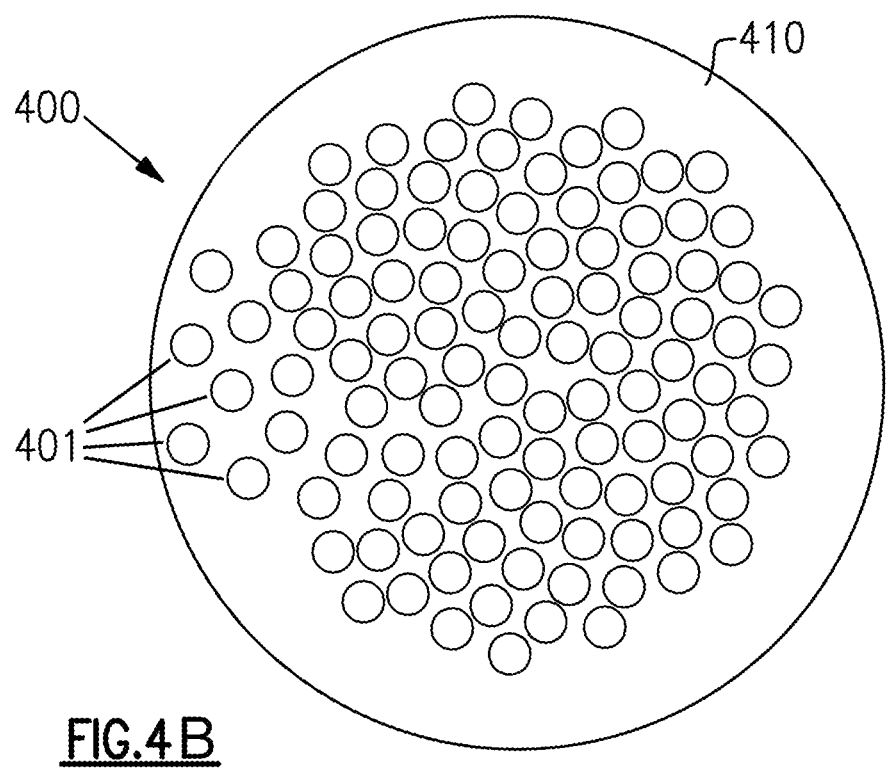
FIG. 4B shows yet another exemplary embodiment of a larger FORHT tubesheet.

FIG. 4A shows an exemplary FORHT tubesheet 400 pattern for a heat exchanger. As described hereinabove, holes 403 of the tubesheet 400 pattern are defined by cylindrical walls 401 made in a sheet 410 by any suitable manufacturing means. 109 tubes could be used, however the resultant 2 mm web spacing is possibly too small, and therefore less desirable for efficient heat exchanger operation. By going to a 3.3 mm web, more efficient operation would be possible, however the outer tubes on the tube sheet can end up too close to the interior walls of the heat exchanger cylindrical enclosure. Sheet 410 can be made from any suitable material with sufficient strength, heat tolerance, and ability to mechanically couple to tubes. Sheet 410 can, for example, be made from a metal, such as any suitable type of steel which can be welded, for example, to steel tubes. FIG. 4B shows another exemplary larger embodiment of a FORHT tubesheet which also solves both the problems of inter-tube spacing and the spacing between the tubes and the interior wall of the heat exchanger. FIG. 4B shows three exemplary spirals with a larger inter-hole spacing. Only three spirals are modified for a larger inter-hole spacing from FIG. 4A for comparison and simplicity of illustration. FIG. 4B shows how the spacing between about same sized holes can be increased over the FORHT pattern of FIG. 4A on a larger tube sheet. While only three spirals have been expanded for simplicity and comparison in the illustration of FIG. 4B, in practice, the other spirals would also typically be modified for larger inter-hole spacing similar to the three exemplary expanded spirals.

Example: For the same number of 109 tubes, the scaling constant can be changed and the tube sheet can be increased from 624 mm to 724 mm so that the layout now falls sufficiently within the 724 mm tubesheet with a 8.15 mm Phyllotaxis tube hole spacing. In larger embodiments, there can also be fewer holes, with larger spaces between the holes.

Figure 5:
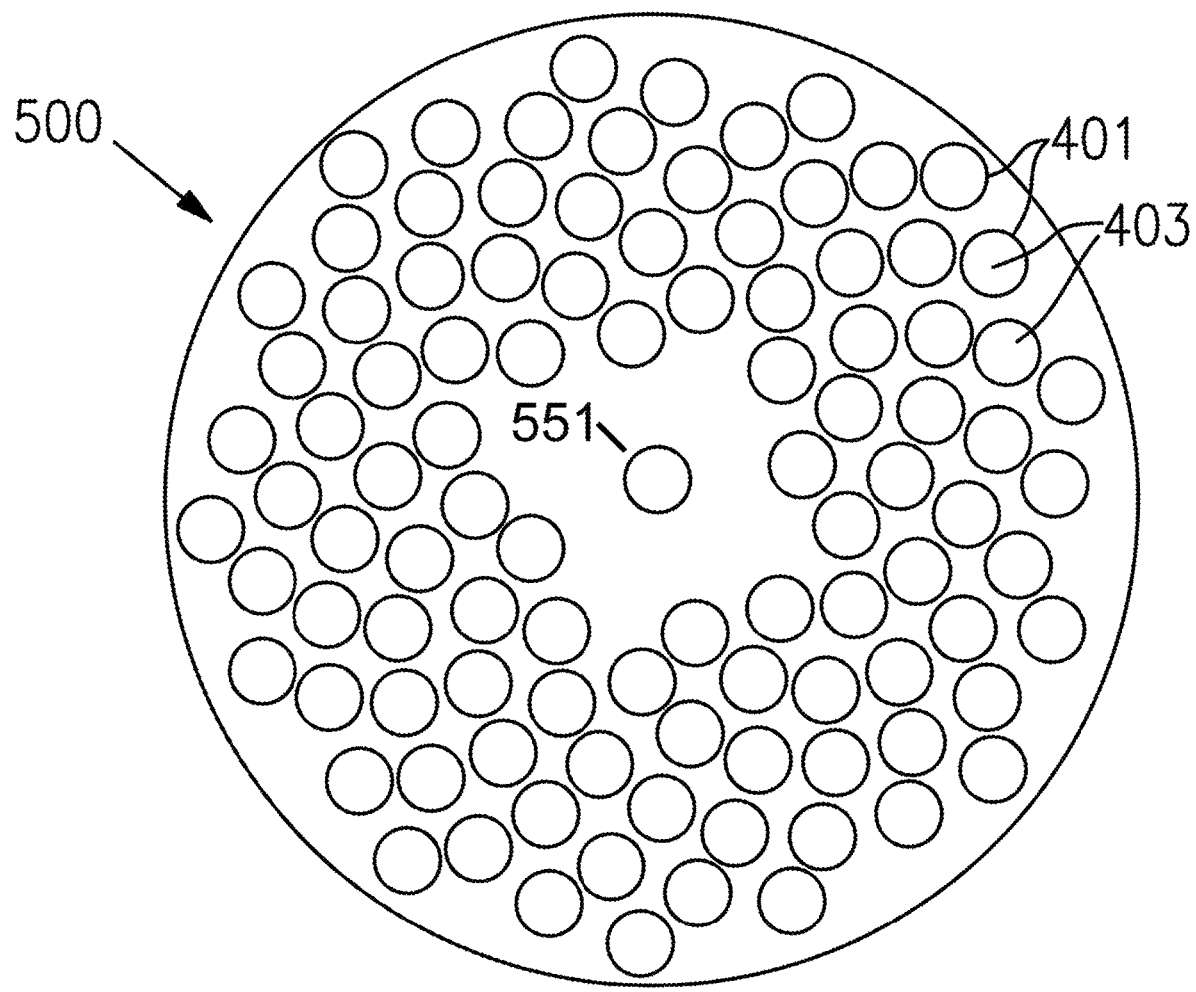
FIG. 5 shows another exemplary embodiment of a FORHT tubesheet starting with N=0, skipping N=1-9.

FIG. 5 shows another exemplary embodiment of a FORHT tubesheet where N=0 for the center tube, and then N=10, 11, 12 . . . skipping N=1-9, which creates a central axial flow channel for fluid delivery to the center of the heat exchanger, from which point the fluid can flow radially across the heat transfer tubes or pins.

An existing 30" enclosure with modification to the outer doors of a hot water heater can house the slightly larger tubesheet which has been increased diameter of 100 mm over an earlier 624 mm layout. By increasing the Tubesheet from 624 mm to 724 mm we gain the following benefits: 1. allows a unique Phyllotaxis (patent pending) tube locating pattern, 2. Increases the minimum web spacing between tubes from 3.68 mm for AIC Cartesian layout to 8.15 mm for a new Phyllotaxis pattern layout, 3. Provides a wider web between the tubes helps support the walls during tube expansion, 4. The welds will not overlap and create stress riser locations, 5. The tubesheet will be cooler between the tubes, improving reliability. It was realized that the tube density leads to higher heat and more frequent failure of heat exchangers using some prior art layout designs, 6. More uniform heat transfer under the tubesheet because this pattern does not have any undesirable preferred flow paths from the center to the perimeter. Other Cartesian patterns have multiple low pressure drop pathways from the center to the perimeter. This will create channels of high flow and low flow, with the low flow areas more susceptible to boiling and scale deposits under the tubesheet, and, 7.

Example: A heat exchanger has at least two tube sheets. The heat exchanger includes a heat exchanger cylindrical enclosure having a heat exchanger radius. Each tube sheet of at least two tubesheets has a tube sheet 400 pattern defining a plurality of holes 403 defined by cylindrical walls 401 in sheet 410. Each hole 403 supports a heat exchanger tube disposed lengthwise along a long axis of the heat exchanger cylindrical enclosure. The holes 403 are disposed according to a phyllotaxis layout or pattern. Each of a plurality of phyllotaxis arcs of the phyllotaxis layout terminate at different locations along an arc radius on the tube sheet at a phyllotaxis arc termination radius less than a tube sheet radius.

The prior art center fed radial Cartesian based flow patterns were realized to not be optimized for heat exchanger heat flow efficiency. According to the new FORHT layout described hereinabove there is an optimized element count and minimized bypass.

A more efficient and cost effective heat exchanger operation can be achieved by replacing the traditional tube sheet patterns with a tube sheet pattern that follows a new FORHT layout that determines the location of tubes within a heat exchanger based on the "golden ratio".

Heatsinks

Heatsinks are typically square, or rectangular. Regardless of the shape of the heat sink base structure, the posts or fins of heat sinks of the prior are most often laid out in rows and/or columns. One variation of the heatsink includes a cross line pattern where the lines were derived from the outer arms of a phyllotaxis. However, none of those solutions related directly to a radial heat outflow, rather to improve heat transfer using a conventional linear air flow (e.g. from a side mounted fan).

It was realized that a new way to view heatsinks is according to a radial heat transfer. For an efficient radial transfer of heat, the radial paths should be substantially balanced. The problem with introducing radial heat transfer to non-optimized structures, such as conventional heat sinks, is that radial or radial like heat flows can be established, however the various radial heat flows will be non-uniform, setting up undesirable preferred radial or radial like flows. These undesirable preferred radial flows starve the remaining non-preferred radial paths and leads to heat sink inefficiencies.

For example, fan placed above a conventional heat sink blowing down over the posts of a conventionally designed post and/or finned heat sink might set up various radial or radial like heat flows. However, there will be preferred and non-preferred paths leading to inefficient overall radial heat flow, and therefore an inefficient radial mode heat sink. Similarly, the use of edges or crossed side arms of a Phyllotaxis while possibly improving the operation of a linear flow heatsink, will not provide an efficient radial flow heat sink.

In the prior art, regardless of the source and angle of incident heatsink air flow (or liquid flow), heat sinks have simply been provided which experimentally provide a sufficient heat transfer to maintain a desired or tolerable Delta-T across the heat sink (e.g. a temperature difference between an enclosure or package and the ambient air), or to limit the temperature rise of a particular enclosure or package (e.g. a semiconductor or CPU case or package).

However, by changing from a linear heat flow to a radial heat flow mode of operation, it was realized that the new FORHT layout developed for heat exchangers of hot water heaters (and applicable to heat exchangers in general), can also be applied to a new FORHT heatsink structure, such as for a heatsink used in electronics cooling applications.

As a most general example, the same equations described hereinabove for placement of holes in a tubesheet of heat exchanger can be used to determine the position of posts, fins, heat pipes, or any other suitable solid structures of a heat sink. Except, unlike pairs of tubesheets which support a plurality of tubes between them, typically a heat sink has a first surface from which the posts, fins, heat pipes, or any other suitable solid structures protrude outwards. Typically, but not necessarily, the posts, fins, heat pipes, or any other suitable solid structures protrude about perpendicular to the heat sink surface, typically the flat surface of a heatsink plate. Accordingly, any scaled version of the patterns described for tubesheets can also be used for the placement of posts, fins, heat pipes, or any other suitable solid structures on the surface of a heatsink which operates in a radial heat transfer mode of operation.

Baffles

It was also realized that a new FORHT heat exchanger can include baffles to further improve the radial flow of gas or fluid past the posts or tubes of a FORHT heat sink or heat exchanger.

Figure 6:
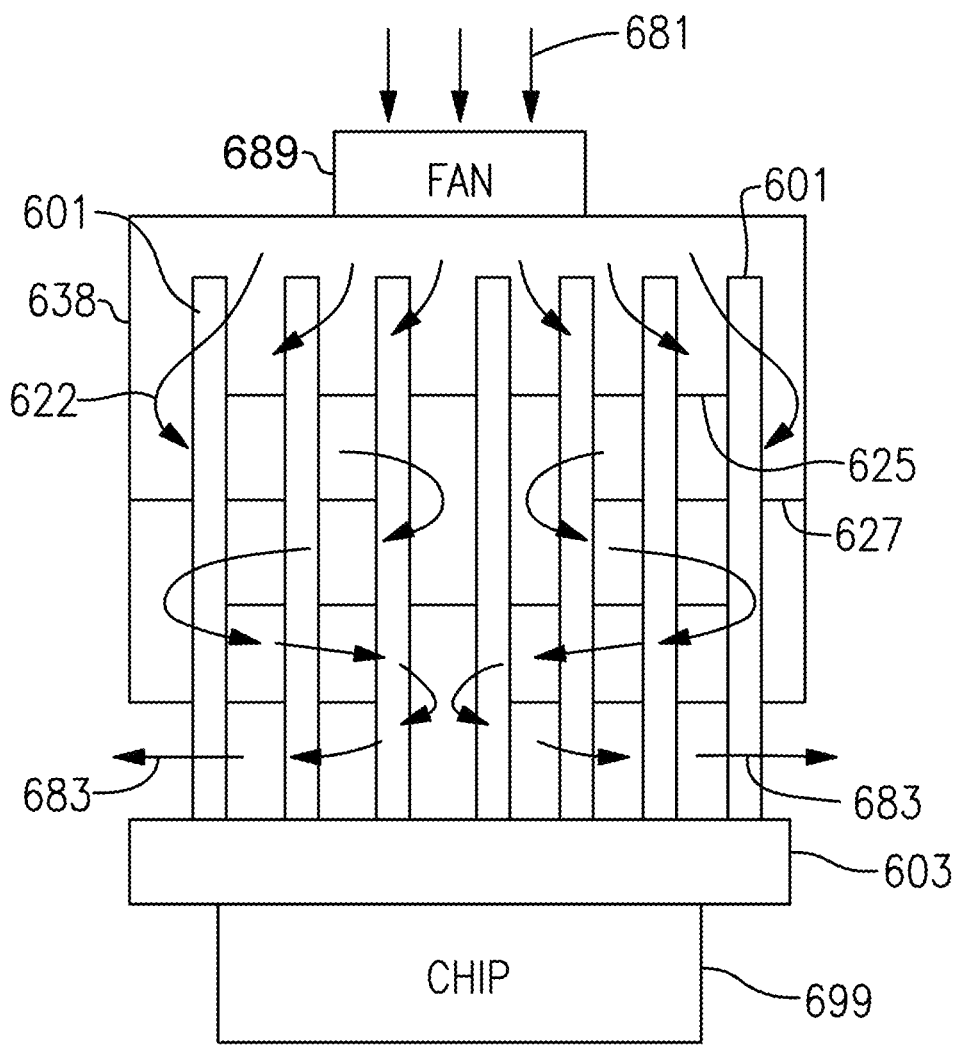
FIG. 6 shows a schematic flow drawing of an exemplary FORHT heat sink with baffles.

FIG. 6. shows a schematic flow drawing of an exemplary FORHT heat sink with baffles for removing heat from a heat source 699. In this exemplary embodiment, there are two types of baffles, donut baffle 627 and disk baffle 625. Cooling air 681 is blown through the FORHT heat sink, such as by a fan 689. The radial air flow 622 is directed more efficiently through the posts 601 extending from and mounted to a base plate 603 of the FORHT heat sink by the combination donut baffles 627 and disk baffles 625. Disk baffles 625 direct the radial air flow 622 towards the enclosure walls such as the wall of cylindrical enclosure 638. The radial air flow 622 below the disk baffle 625 returns inward towards the center hole of the following donut baffle 627. Thus radial air flow 622 can be directed closer to a substantially perpendicular flow across the posts 601 further improving the uniformity of the radial air flow 622 over the posts 601. There can be any number of suitable baffles used from one baffle of either type, one baffle of each type through as many number of baffles as desired. After flowing through one or more baffles, the radial warm air 683 exits the FORHT heat sink.

Figure 7:
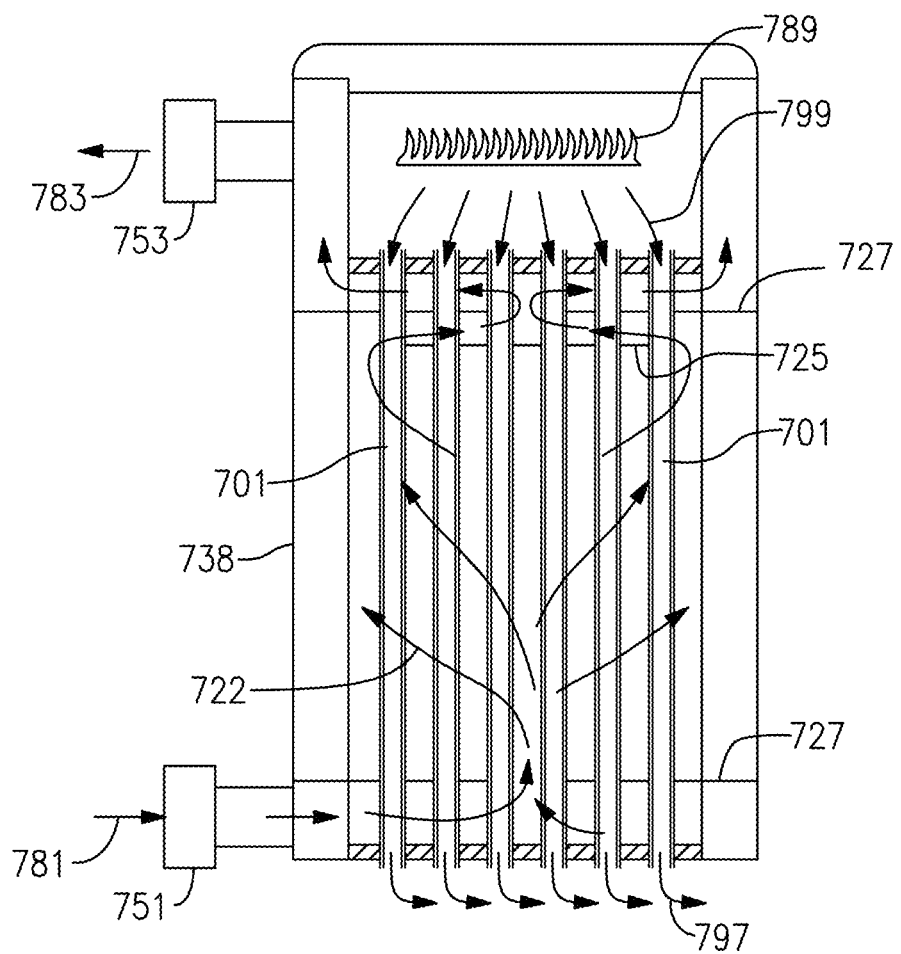
FIG. 7 shows a schematic flow drawing of an exemplary FORHT heat exchanger with baffles.

FIG. 7. shows a schematic flow drawing of an exemplary FORHT heat exchanger for a hot water heater with baffles. Hot gas 799 from fire 789 flows through tubes arranged as described hereinabove in a FORHT pattern. After transferring the heat energy from the hot gas to the cold water via the FORHT heat exchanger, the resultant cool gas 797 leaves the tubes 701 at the opposite end of each tube 701. Cold water 781 enters the heat exchanger enclosure via cold water inlet 751. A first donut baffle 727 causes the cold water flowing into the cylindrical heat exchanger enclosure 738 to flow from the center opening in the donut baffle 727 as a radially flowing fluid 722 past the heat exchanger tubes 701. As can be seen by the lower section of the exemplary FORHT heat exchanger of FIG. 7, even just one donut baffle 727 can improve the radially flowing fluid 722 over the posts 701. Better efficiency can be achieved where the radially flowing fluid 722 flows substantially perpendicular to a long direction of the posts. One such baffle arrangement can be seen near the top of the heat exchanger, where a disc baffle 725 can be seen to direct radially flowing fluid 722 though the circular opening between the disc baffle 725 and the inside surface of the enclosure wall 738 towards the center opening of a donut baffle 727 shown above the disc baffle 725 in the exemplary heat exchanger of FIG. 7. By the top of the heat exchanger, cold water 781 has been heated by and exits the heat exchanger at the hot water outlet 753 as hot water 783.

Heat Pipes: Any of the tubes or posts described hereinabove can be replaced by one or more heat pipes. In embodiments which include heat pipes, typically in addition to the flow of heat to or from the posts or tubes caused by a radial flow of across the posts or tubes, there would also be a flow of heat energy from end to end in each heat pipe.

Figure 8:
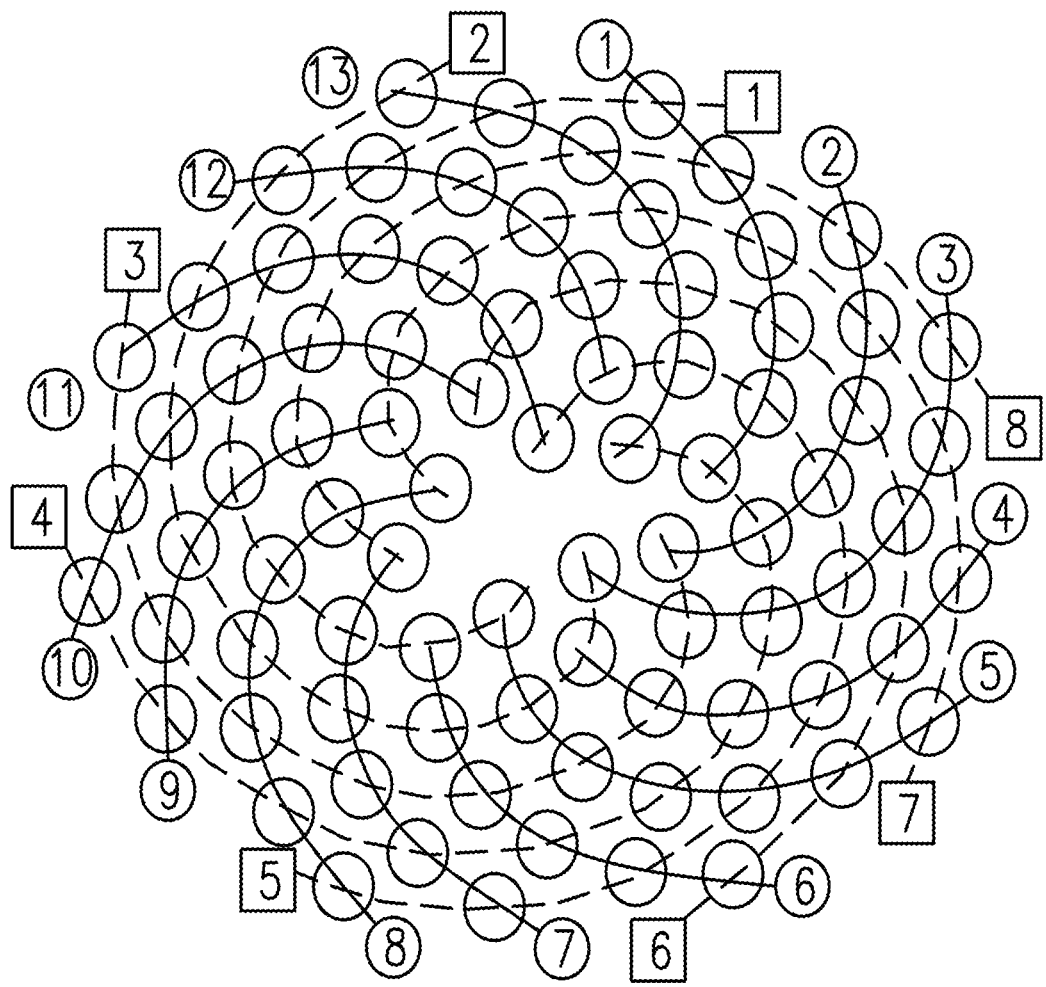
FIG. 8 shows a drawing of an exemplary FORHT pattern which defines eight counter clockwise spiral arcs and thirteen clockwise spiral arcs.

Example: FIG. 8 shows a drawing of an exemplary FORHT pattern. The circles of the exemplary FORHT pattern define the plurality of spiral arcs. As shown in the exemplary FIG. 8, there are 8 counter clockwise spiral arcs and 13 clockwise spiral arcs. The circles can represent, for example, the holes of a tube sheet, or the positions of rods or tubes or heat pipes protruding from a surface, such as a surface of a heat sink. The number of counter clockwise spiral arcs and clockwise spiral arcs can be any suitable numbers and combinations, for example, 5, 8; 8, 13; 13, 21; 21, 34; etc. respectively. The number of clockwise and the number of counter clockwise spiral arcs of a FORHT pattern are respectively consecutive Fibonacci numbers.

Radial Flow Patterns: As described hereinabove, a phyllotaxis pattern, such as a FORHT pattern improves radial heat flow, particularly in heat transfer applications using tubes, posts, and/or heat pipes. The radial heat transfer of the radial flow pattern may be accomplished, for example, by a flow of a fluid or gas across a plurality of tubes, posts, or heat pipes. A problem with existing patterns and layouts is that, while appearing to be about radially symmetric, these prior art patterns actually cause non-uniform radial heat flow with undesirable preferred areas and paths of flow which starve other parts of the pattern. What is needed is a layout or pattern which beyond giving an appearance of radial symmetry, actually optimizes and provides a substantially uniform radial flow of heat energy. It was realized that a phyllotaxis pattern, such as a FORHT pattern can provide substantially uniform radial flow heat energy, particularly in heat transfer applications using tubes, posts, and/or heat pipes.

Figure 9:
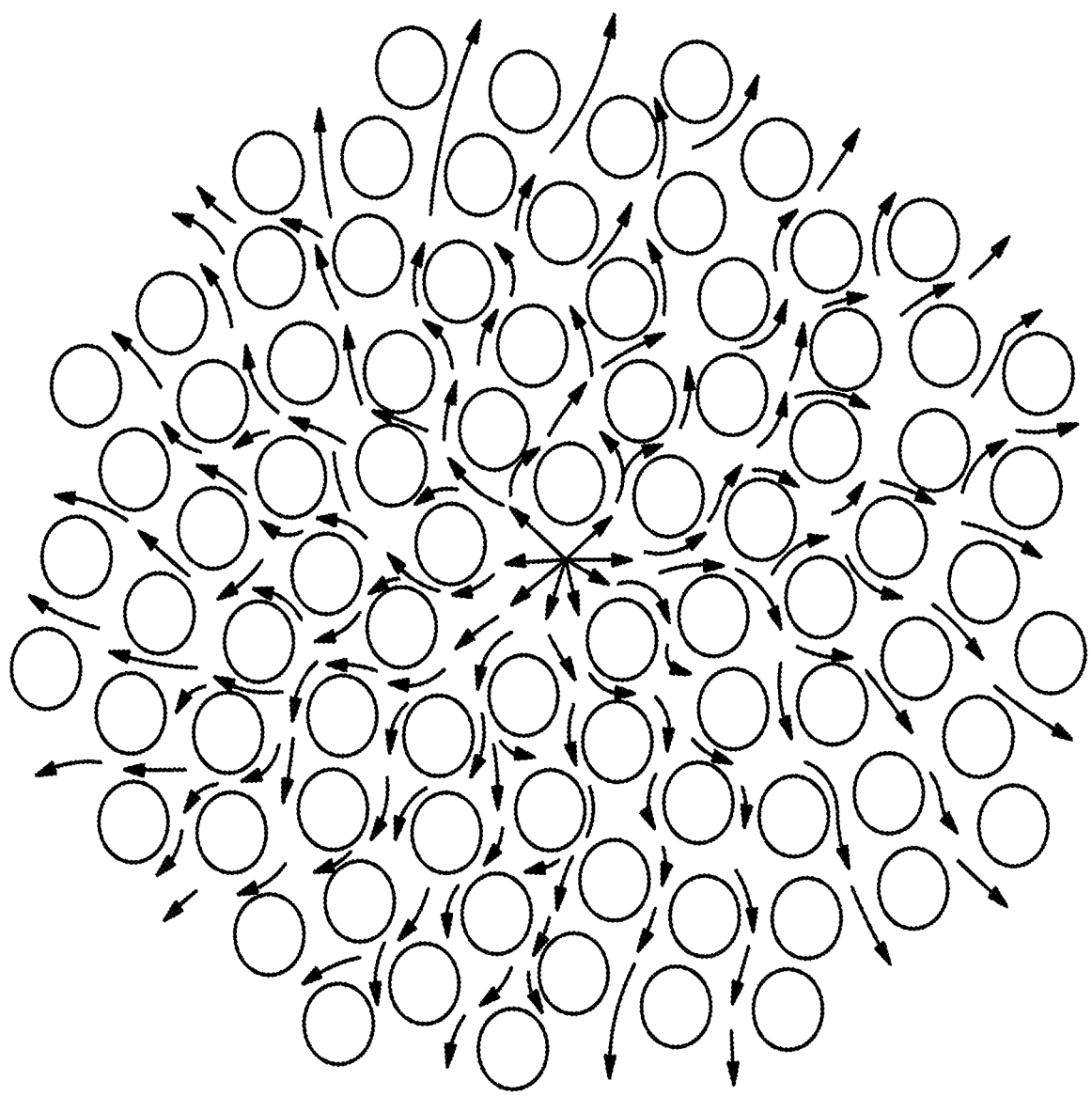
FIG. 9 shows an exemplary FORHT pattern solution which provides a radial flow of heat energy represented by the arrows with substantially no preferred flow pathway.

FIG. 9 shows one such exemplary FORHT pattern solution which provides a radial flow of heat energy represented by the arrows with substantially no undesirable preferred flow pathways. The represented flow of heat energy can be facilitated, for example, by a flow of a fluid such as, for example, water in the case of a heat exchanger of a hot water heater, or a gas, such as, for example, a flue gas from a burner of a hot water heater, across any suitable structure of the pattern.

Figure 10:
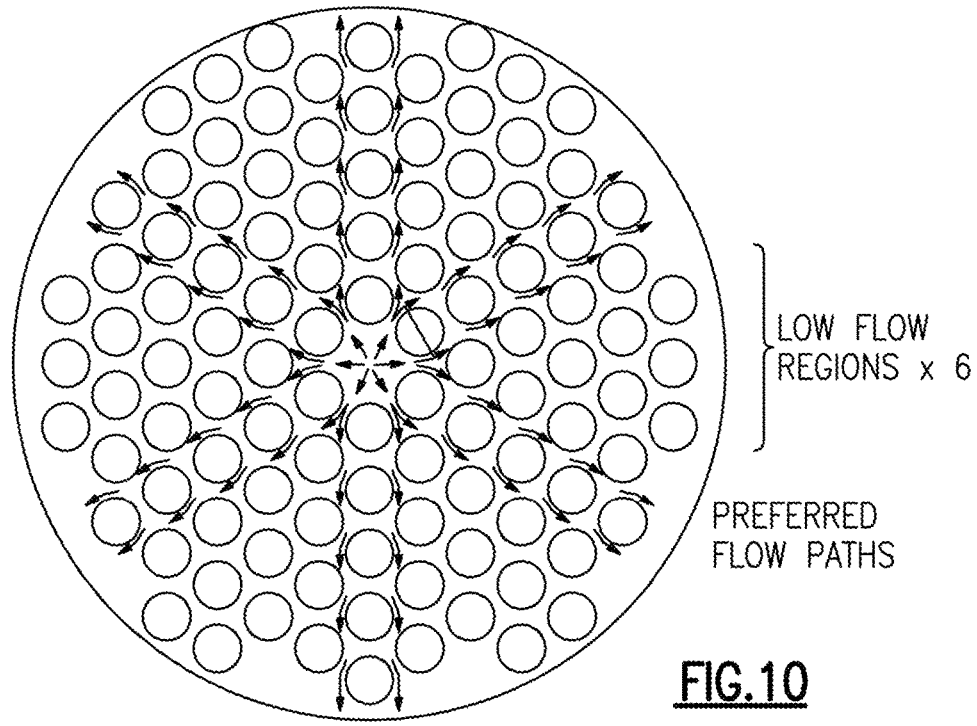
FIG. 10 shows, by contrast, an exemplary HEX pattern of the prior art.

FIG. 10 shows, by contrast, an exemplary HEX pattern of the prior art. The undesirable preferred flow paths of heat energy can be seen to create relatively large regions of low flow. The regions of low flow starved by the undesirable preferred paths leads to significant inefficiency because the tubes or posts in those regions are less effective at heat transfer, because the heat transfer coefficient is directly proportional to fluid velocity.

Figure 11:
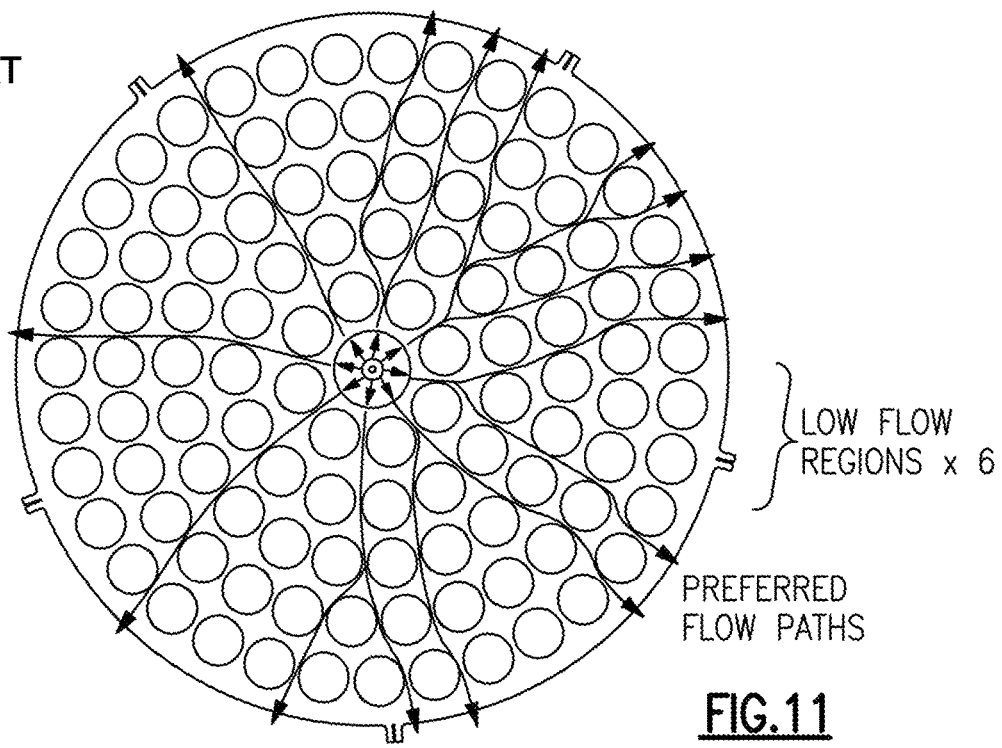
FIG. 11 shows another exemplary concentric ring pattern of the prior art.

FIG. 11 shows another exemplary concentric ring pattern of the prior art. Similar to the HEX pattern of FIG. 10, there are again well defined undesirable preferred paths and starved low flow regions.

Thus, it can now be better appreciated that a heat transfer device, such as, for example, a heat exchanger or heat sink, can be more efficient if the heat transfer device for transferring heat energy to or from a gas or fluid flowing radially across a plurality of posts or tubes includes a plurality of posts or tubes which are disposed on and protruding substantially perpendicular to a plate surface, where at least about 50% of the plurality of posts or tubes are disposed according to a phyllotaxis layout wherein each arc of a plurality of phyllotaxis spiral arcs of the phyllotaxis layout terminates at different locations along an arc radius on the plate at a phyllotaxis arc termination radius less than a perimeter radius.

Variations from a phyllotaxis pattern: In some embodiments, at least about 85% of the tubes, posts, heat pipes, and/or holes, are laid out according to a phyllotaxis pattern, such as, for example a FORHT pattern. For example, in some applications, it might be desirable to alter the pattern near the center, such as for mounting, welding, or other typical mechanical considerations. In other embodiments, it has been realized that heat transfer devices as described hereinabove can be effective where about 50% (at least about half) of the of the plurality of posts or tubes are disposed according to a phyllotaxis layout.

Alternative similar series and patterns: Those skilled in the art will recognize that other Phyllotaxis patterns exist, such as for example a pattern based on the very similar and well known Lucas series. Other equivalent Phyllotaxis patterns, such as a Phyllotaxis pattern based on the Lucas series, are intended to fall within the scope of the application.

Figure 12A:
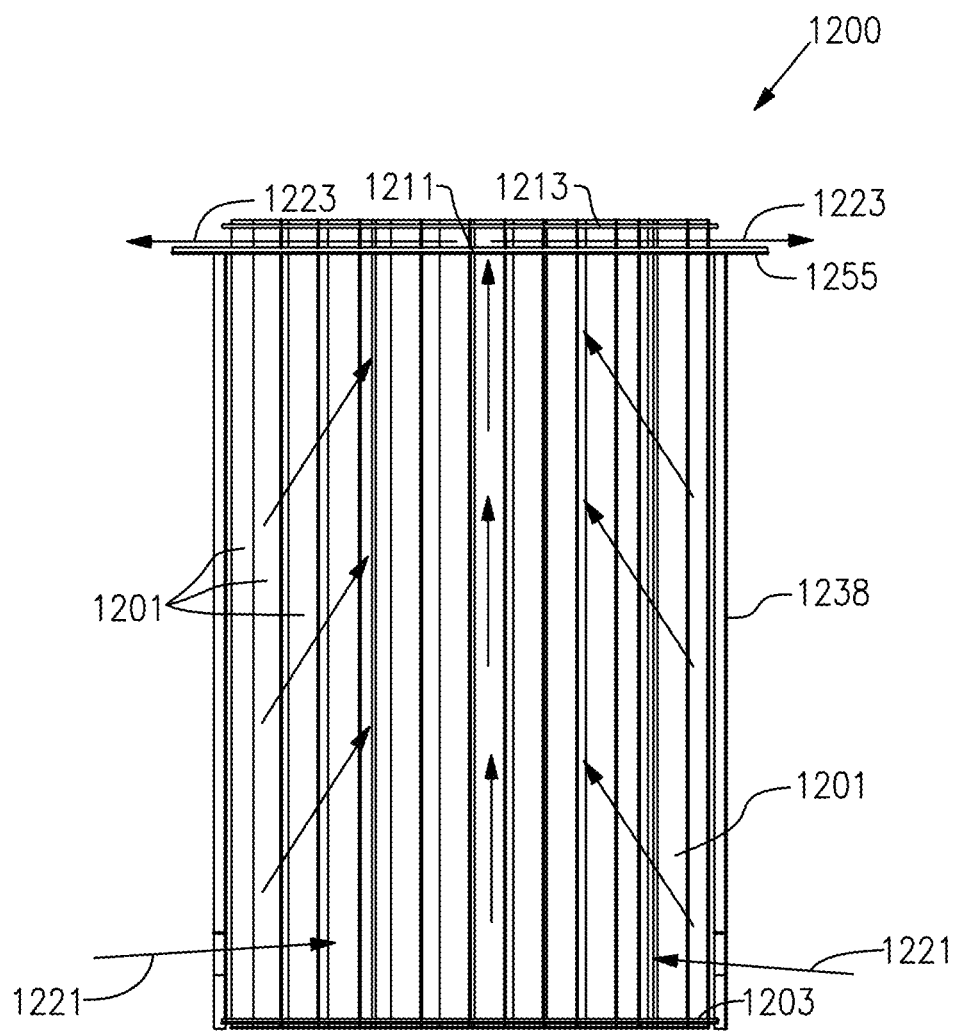
FIG. 12A shows a schematic diagram of the FORHT flow pattern of an exemplary two plate Phyllotaxis Heat Exchanger.
Figure 12C:
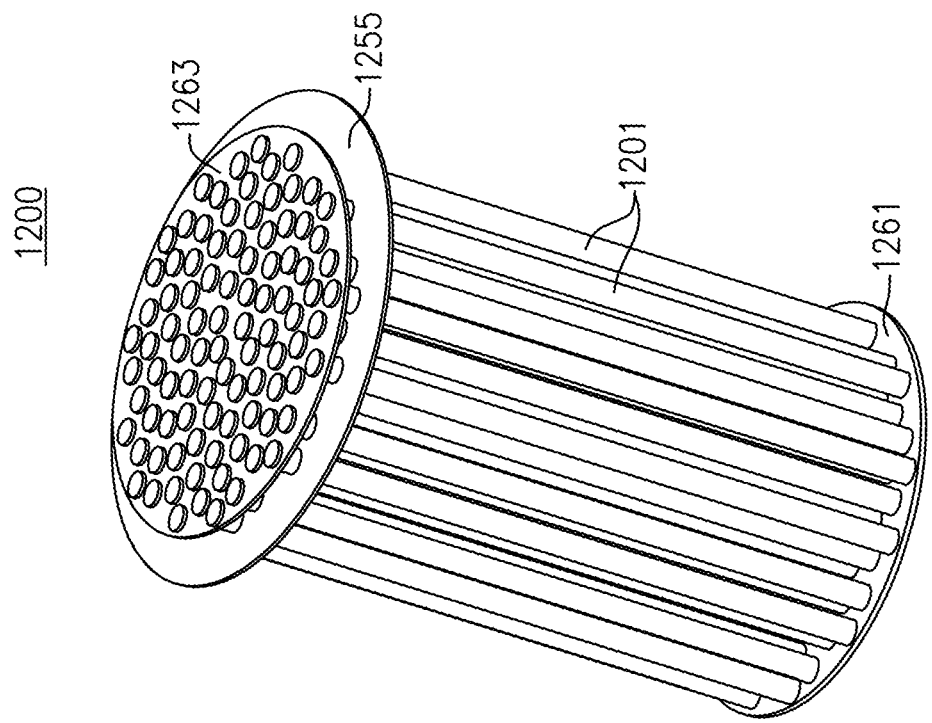
FIG. 12C shows an isometric view of the Phyllotaxis Heat Exchanger of FIG. 12A.
Figure 12B:
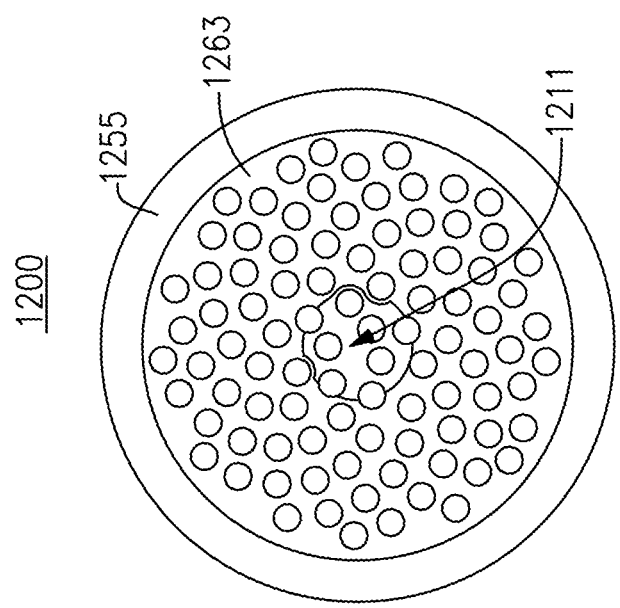
FIG. 12B shows an end view of the Phyllotaxis Heat Exchanger of FIG. 12A.

Example: FIG. 12A, FIG. 12B, and FIG. 12C show an exemplary two plate Phyllotaxis Heat Exchanger with FORHT (Fibonacci Optimized Radial Heat Transfer) flow pattern through a center hole baffle with a radial outward flow between the upper plate and the center hole baffle. FIG. 12B shows an end view of the Phyllotaxis Heat Exchanger of FIG. 12A. A center hole can be seen in the baffle plate. FIG. 12C shows an isometric view of the Phyllotaxis Heat Exchanger of FIG. 12A.

Referring to FIG. 12C, a Phyllotaxis Heat Exchanger heat transfer device transfers heat energy to or from a gas or fluid flowing radially across a plurality of posts or tubes 120. A plate 1203 has a plate surface 1261. A second plate 1213 has a second plate surface 1263. A plurality of posts or tubes 1201 are disposed on and protruding substantially perpendicular to the plate surface 1261. At least about 50% of the plurality of posts or tubes 1201 are disposed according to a phyllotaxis layout wherein each arc of a plurality of phyllotaxis spiral arcs of the phyllotaxis layout terminates at different locations along an arc radius on the plate at a phyllotaxis arc termination radius less than a perimeter radius.

FIG. 12A shows a schematic diagram of the exemplary two plate Phyllotaxis Heat Exchanger 1200 with a FORHT flow pattern. In the schematic flow diagram of FIG. 12A, water flows into cylindrical tank 1238 along and across pipes of a hot gas flow (e.g. FIG. 7, 799, 797). The pipes 1201 are supported by plates 1203, 1213. The arrows show a fluid flow into the heat exchanger (e.g. cold water) and a fluid flow out of the heat exchanger (e.g. hot water). A donut baffle 1255 causes cold water entering the heat exchanger shown as inlet cold water 1221 to flow across the pipes 1201 and through opening 1211 in the donut baffle 1255. The water exiting opening 1211 flows about radially near plate 1213 as radial outflow water 1223.

Figure 13A:
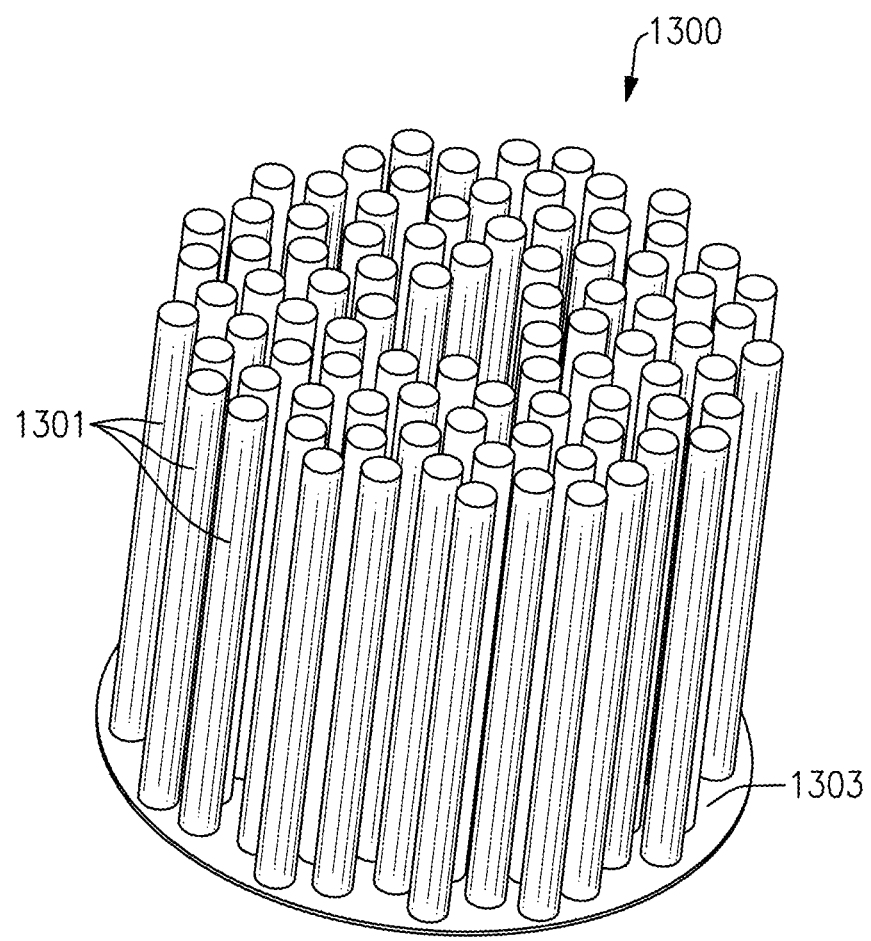
FIG. 13A shows an isometric view of an exemplary embodiment of a single plate Phyllotaxis heat sink.
Figure 13B:
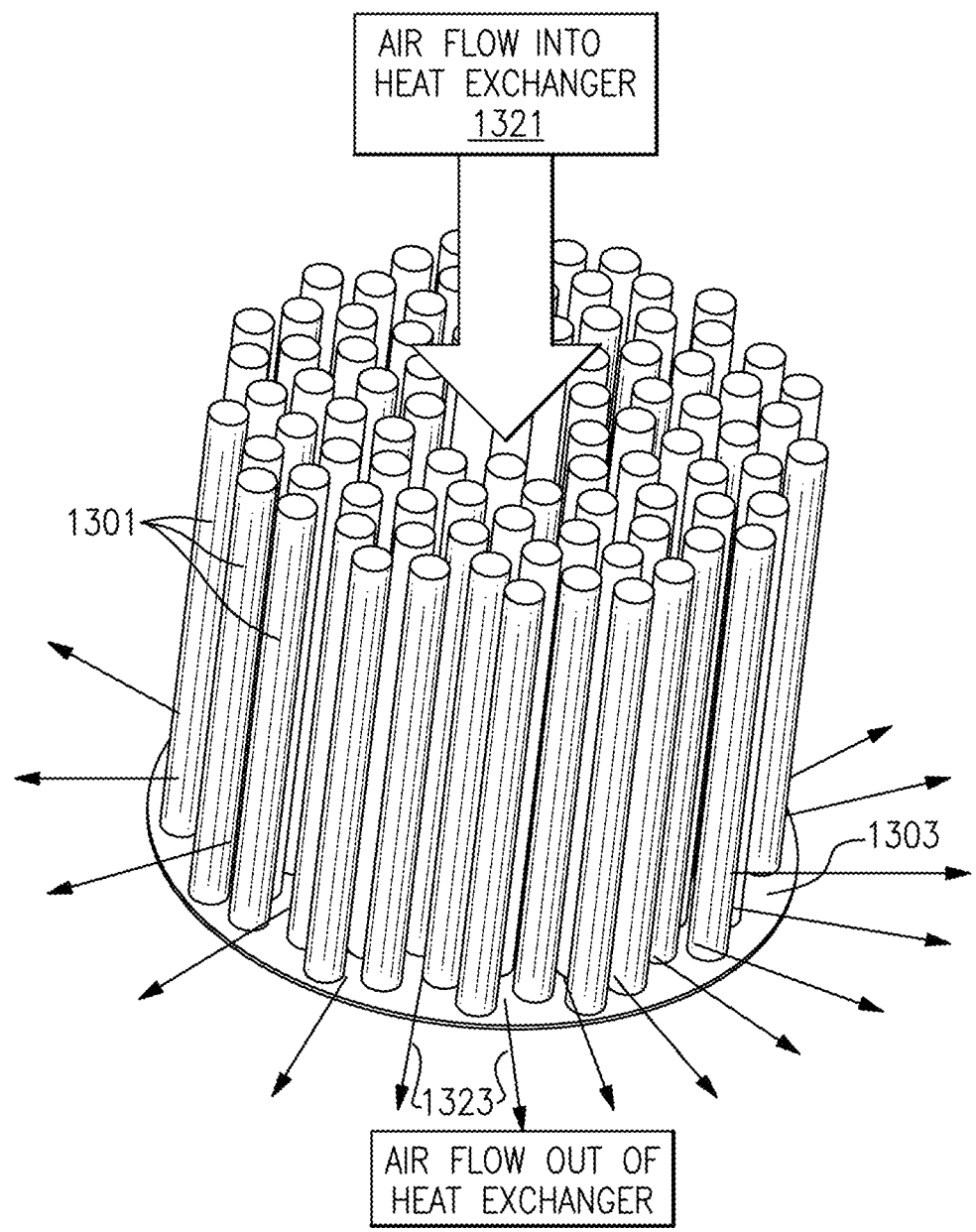
FIG. 13B shows an air flow diagram for the single plate Phyllotaxis heat sink of FIG. 13A.

Example: FIG. 13A and FIG. 13B show an exemplary embodiment of a single plate Phyllotaxis pin heat sink for a radial flow air cooling of electronic components. FIG. 13A shows an isometric view of an exemplary embodiment of the single plate Phyllotaxis heat sink 1300 having pins or posts 1301 mounted to a single plate 1303. FIG. 13B shows an air flow diagram for the single plate Phyllotaxis heat sink of FIG. 13A. Referring to FIG. 13B, the air flow to the exemplary heat sink 1300 can be, for example, center fed as shown by the airflow to the heat exchanger 1321 and along and between pins or posts 1301. The heated air (which cools the heat sink) exits as the air flow out of the heat exchanger 1323 near the single plate 1303.

As shown in FIG. 13A, a single plate Phyllotaxis pin heat sink heat transfer device transfers heat energy to or from a gas or fluid flowing radially across a plurality of posts 1301. A plate 1303 has a plate surface 1361. A plurality of posts 1301 or tubes are disposed on and protruding substantially perpendicular to the plate surface 1361. At least about 50% of the plurality of posts 1301 or tubes are disposed according to a phyllotaxis layout wherein each arc of a plurality of phyllotaxis spiral arcs of the phyllotaxis layout terminates at different locations along an arc radius on the plate at a phyllotaxis arc termination radius less than a perimeter radius. At least one of the pins can be a heatpipe.

A new FORHT heat transfer device as described hereinabove provides a substantially uniform radial flow of heat for a substantially uniform and substantially optimal heat transfer process. A FORHT heat transfer device provides a radial flow substantially without undesirable preferred heat flow paths. Without preferred pathways, the radial outflow from center in any radial direction defines an equally outward (or inward) flow with a substantially uniform radial pressure drop.

Surface textures or treatments: In some embodiments, a surface of at least one or more of the posts or tubes of the plurality of posts or tubes can include a nano texture or a semi-porous surface treatment or material deposit. Also, a surface of at least one or more of the posts or tubes of the plurality of posts or tubes can include a surface treatment or a variable density surface treatment.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. A heat transfer device for transferring heat energy to or from a gas or fluid flowing radially across a plurality of posts or tubes comprising:
    a plate having a plate surface; and
    a plurality of posts or tubes disposed on and protruding substantially perpendicular to said plate surface, at least about 50% of said plurality of posts or tubes disposed according to a phyllotaxis layout; and
    each arc of a plurality of phyllotaxis spiral arcs of said phyllotaxis layout terminates at different locations along an arc radius on said plate at a phyllotaxis arc termination radius less than a perimeter radius, said plurality of phyllotaxis spiral arcs comprising:
        a first total number of clockwise spiral arcs, said first total number is a Fibonacci number, and
        a second total number of counter clockwise spiral arcs, said second total number is a different Fibonacci number.

2. The heat transfer device of claim 1, wherein at least one or more posts or tubes of said plurality of posts or tubes comprises a heat pipe.

3. The heat transfer device of claim 1, wherein a surface of at least one or more posts or tubes of said plurality of posts or tubes comprises a nano texture or a semi-porous surface treatment or material deposit.

4. The heat transfer device of claim 1, wherein a surface of at least one or more posts or tubes of said plurality of posts or tubes comprises a surface treatment or a variable density surface treatment.

5. The heat transfer device of claim 1, wherein said phyllotaxis layout comprises a Fibonacci optimized radial heat transfer (FORHT) pattern.

6. The heat transfer device of claim 1, wherein said plate comprises a first tube sheet having a hole pattern in which each tube of a plurality of tubes is mechanically affixed in each hole of said hole pattern.

7. The heat transfer device of claim 6, further comprising a second tube sheet having substantially a same hole pattern as said first tube sheet, each tube of a plurality of tubes is mechanically affixed in each hole of said hole pattern at an end of each tube opposite said first tube sheet.

8. The heat transfer device of claim 6, wherein said first tube sheet and said plurality of tube are disposed in a cylindrical enclosure.

9. The heat transfer device of claim 8, wherein said heat transfer device comprises a heat exchanger of a hot water heater.

10. The heat transfer device of claim 9, wherein a gas flows through each of the tubes and a fluid flows about radially in the cylindrical enclosure along a plurality of outer tube walls to exchange heat energy between the gas and the fluid.

11. The heat transfer device of claim 9, further comprising at least one donut baffle to cause cold water entering the heat exchanger to flow about radially.

12. The heat transfer device of claim 9, further comprising at least one disc baffle to cause an about radial flow of water in a direction from an inner wall surface of said cylindrical enclosure towards a center long axis of said cylindrical enclosure of said heat exchanger.

13. The heat transfer device of claim 9, further comprising at least one disc baffle and at least one adjacent donut baffle to cause an about radial flow of water in a direction from an inner wall surface of said cylindrical enclosure towards a center opening of said adjacent donut baffle.

14. The heat transfer device of claim 1, wherein said posts or tubes comprise posts or tubes of a heat sink.

15. The heat transfer device of claim 14, further comprising a fan to blow a cooling air into said plurality of posts or tubes in a direction of about a long axis of each post or tube of said plurality of posts or tubes such that an air flow turns into a substantially symmetric radial flow pattern across said posts or tubes to cause a substantially uniform radial air flow through said plurality of posts or tubes over said plate.

16. The heat transfer device of claim 14, wherein said heat sink further comprises at least one baffle to effect about a radial air flow about perpendicular to said plurality of posts.

17. The heat transfer device of claim 1, wherein said Fibonacci number and said different Fibonacci number are consecutive Fibonacci numbers.

* * * * *